(12) United States Patent
Tabatake (10) Patent No.: US 11,903,264 B2
(45) Date of Patent: Feb. 13, 2024

(54) DISPLAY DEVICE

(71) Applicant: Japan Display Inc., Tokyo (JP)

(72) Inventor: Hiroshi Tabatake, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/185,549

(22) Filed: Mar. 17, 2023

(65) Prior Publication Data

US 2023/0301142 A1   Sep. 21, 2023

(30) Foreign Application Priority Data

Mar. 17, 2022   (JP) .................. 2022-042744

(51) Int. Cl.
| | |
|---|---|
| *H10K 59/122* | (2023.01) |
| *G09G 3/3225* | (2016.01) |
| *H10K 59/80* | (2023.01) |
| *H10K 59/131* | (2023.01) |

(52) U.S. Cl.
CPC ......... *H10K 59/122* (2023.02); *G09G 3/3225* (2013.01); *H10K 59/131* (2023.02); *H10K 59/873* (2023.02); *G09G 2300/0452* (2013.01); *G09G 2300/0842* (2013.01)

(58) Field of Classification Search
CPC .. H10K 59/122; H10K 59/131; H10K 59/873; H10K 59/352; H10K 59/80516; H10K 59/8051; H10K 59/8052; G09G 3/3225; G09G 2300/0452; G09G 2300/0842; G09G 2300/0426; G09G 3/3233
See application file for complete search history.

(56) References Cited

U.S. PATENT DOCUMENTS

| | | | | |
|---|---|---|---|---|
| 8,610,344 B2 * | 12/2013 | Matsuda | ............... | G03F 7/0035 |
| | | | | 313/506 |
| 9,478,591 B2 * | 10/2016 | Nam | ..................... | H10K 50/824 |
| 9,960,216 B2 * | 5/2018 | Lee | ..................... | H10K 50/814 |
| 10,026,790 B2 * | 7/2018 | Kim | ..................... | H10K 50/828 |
| 10,586,837 B2 * | 3/2020 | Gao | ..................... | H10K 59/122 |
| 10,680,046 B2 * | 6/2020 | Moon | .................. | H10K 59/173 |
| 11,476,313 B2 * | 10/2022 | Choung | ................. | H10K 71/00 |
| 2004/0160170 A1 | 8/2004 | Sato et al. | | |
| 2009/0009069 A1 | 1/2009 | Takata | | |

(Continued)

FOREIGN PATENT DOCUMENTS

| | | |
|---|---|---|
| JP | 2000-195677 A | 7/2000 |
| JP | 2004-207217 A | 7/2004 |

(Continued)

*Primary Examiner* — Jonathan A Boyd
(74) *Attorney, Agent, or Firm* — XSENSUS LLP (57) ABSTRACT

According to one embodiment, a display device includes a substrate, a circuit layer including a metal-made feed line in a surrounding area, an insulating layer covering the circuit layer, a lower electrode, a rib, a partition above the rib, an upper electrode connected to the partition, an organic layer between the electrodes and a conductive layer connected to the partition. The partition and the conductive layer each includes a metal-made lower portion and an upper portion protruding from a side surface of the lower portion. The lower portion of the conductive layer and the feed line are in contact with each other in the first contact portion in the surrounding area.

13 Claims, 9 Drawing Sheets

(56) References Cited

U.S. PATENT DOCUMENTS

2019/0131365 A1\* 5/2019 Jung ................. H10K 59/1213
2019/0363275 A1   11/2019 Ochi et al.

FOREIGN PATENT DOCUMENTS

| JP | 2008-135325 A | 6/2008 |
|---|---|---|
| JP | 2009-32673 A | 2/2009 |
| JP | 2010-118191 A | 5/2010 |
| WO | 2018/179308 A1 | 10/2018 |

\* cited by examiner

DISPLAY DEVICE

CROSS-REFERENCE TO RELATED APPLICATIONS

This application is based upon and claims the benefit of priority from Japanese Patent Application No. 2022-042744, filed Mar. 17, 2022, the entire contents of which are incorporated herein by reference.

FIELD

Embodiments described herein relate generally to a display device.

BACKGROUND

In recent years, display devices to which an organic light-emitting diode (OLED) is applied as a display element have been put into practical use. Such a display element comprises a lower electrode, an organic layer covering the lower electrode, and an upper electrode covering the organic layer.

To the lower electrode, voltage from the pixel circuit provided for each pixel is supplied. On the other hand, to the upper electrode, a voltage common to the subpixels is supplied. The configuration for supplying voltage to the upper electrode is susceptible to various improvements.

DETAILED DESCRIPTION

In general, according to one embodiment, a display device comprises a substrate, a circuit layer including a pixel circuit disposed in a display area containing pixels, and a metal-made feed line disposed in a surrounding area between an end portion of the substrate and the display area, an insulating layer covering the circuit layer, a lower electrode disposed above the insulating layer in the display area, to which voltage is supplied from the pixel circuit, a rib including an aperture overlapping the lower electrode, a partition disposed above the rib in the display area, an upper electrode opposing the lower electrode and connected to the partition, an organic layer disposed between the lower electrode and the upper electrode and emitting light in response to a potential difference between the lower electrode and the upper electrode and a conductive layer disposed in the surrounding area and connected to the partition. The partition and the conductive layer each includes a metal-made lower portion and an upper portion protruding from a side surface of the lower portion. The lower portion of the conductive layer and the feed line are in contact with each other in the first contact portion located in the surrounding area.

According to a configuration such as above, it is possible to provide a display device with an improved configuration for supplying voltage to the upper electrode of the display element.

An embodiments will be described with reference to the accompanying drawings.

Note that the disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated in the drawings schematically, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown. A direction parallel to the X-axis is referred to as a first direction, a direction parallel to the Y-axis is referred to as a second direction, and a direction parallel to the Z-axis is referred to as a third direction. Viewing structural elements parallel to the third direction Z is referred to as plan view.

The display device of this embodiment is an organic electroluminescent display device comprising an organic light-emitting diode (OLED) as a display element, and can be mounted on televisions, personal computers, in-vehicle devices, tablets, smartphones, mobile phones and the like.

Figure 1:
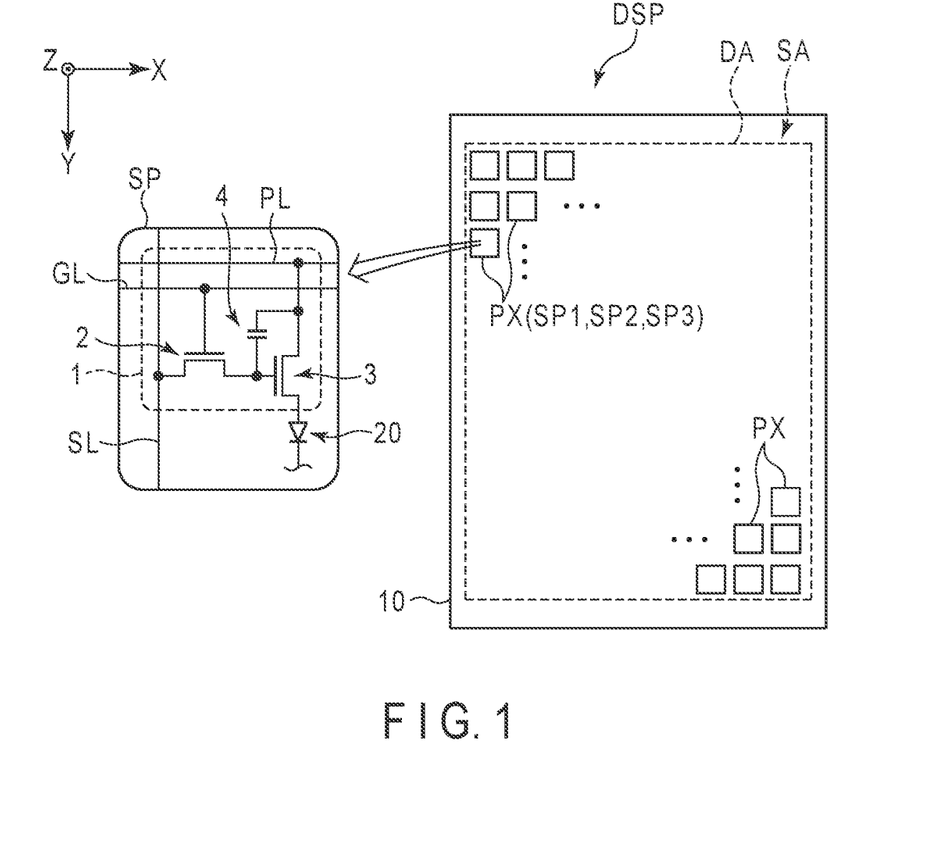
FIG. 1 is a diagram showing a configuration example of a display device according to an embodiment.

FIG. 1 is a diagram showing a configuration example of a display device DSP according to this embodiment. The display device DSP includes a display area DA which displays images and a surrounding area SA around the display area DA on an insulating substrate 10. The substrate 10 may be glass or a flexible resin film.

In this embodiment, the shape of the substrate 10 in plan view is rectangular. Note that the shape of the substrate 10 in plan view is not limited to rectangular, but may be of other shape such as a square, circle or oval.

The display area DA comprises a plurality of pixels PX arranged in a matrix along the first direction X and the second direction Y. The pixels PX each include a plurality of subpixels SP. For example, the pixels PX each includes a red subpixel SP1, a green subpixel SP2 and a blue subpixel SP3. Note that the pixels PX each may include, in addition to the subpixels SP1, SP2 and SP3 or in place of any of the subpixels SP1, SP2 and SP3, subpixels SP of some other color such as white and the like. Further, the combination of colors of the subpixels SP may be those other than red, green and blue, or the number of subpixels SP corresponding to one pixel maybe two or four more.

The subpixels SP each comprise a pixel circuit 1 and a display element 20 driven by the pixel circuit 1. The pixel circuit 1 comprises a pixel switch 2, a drive transistor 3 and a capacitor 4. The pixel switch 2 and the drive transistor 3 are, for example, switching elements constituted by thin-film transistors.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of the source electrode and the drain electrode is connected to a power supply line PL and the capacitor 4, and the other is connected to the display element 20.

The display element 20 is an organic light-emitting diode (OLED) as a light-emitting device. For example, the subpixel SP1 comprises a display element 20 which emits light in a red wavelength range, the subpixel SP2 comprises a display element 20 which emits light in a green wavelength range, and the subpixel SP3 comprises a display element 20 which emits light in a blue wavelength range.

Note that the configuration of the pixel circuit 1 is not limited to that of the example shown in the figure. For example, the pixel circuit 1 may comprise more thin-film transistors and capacitors.

Figure 2:
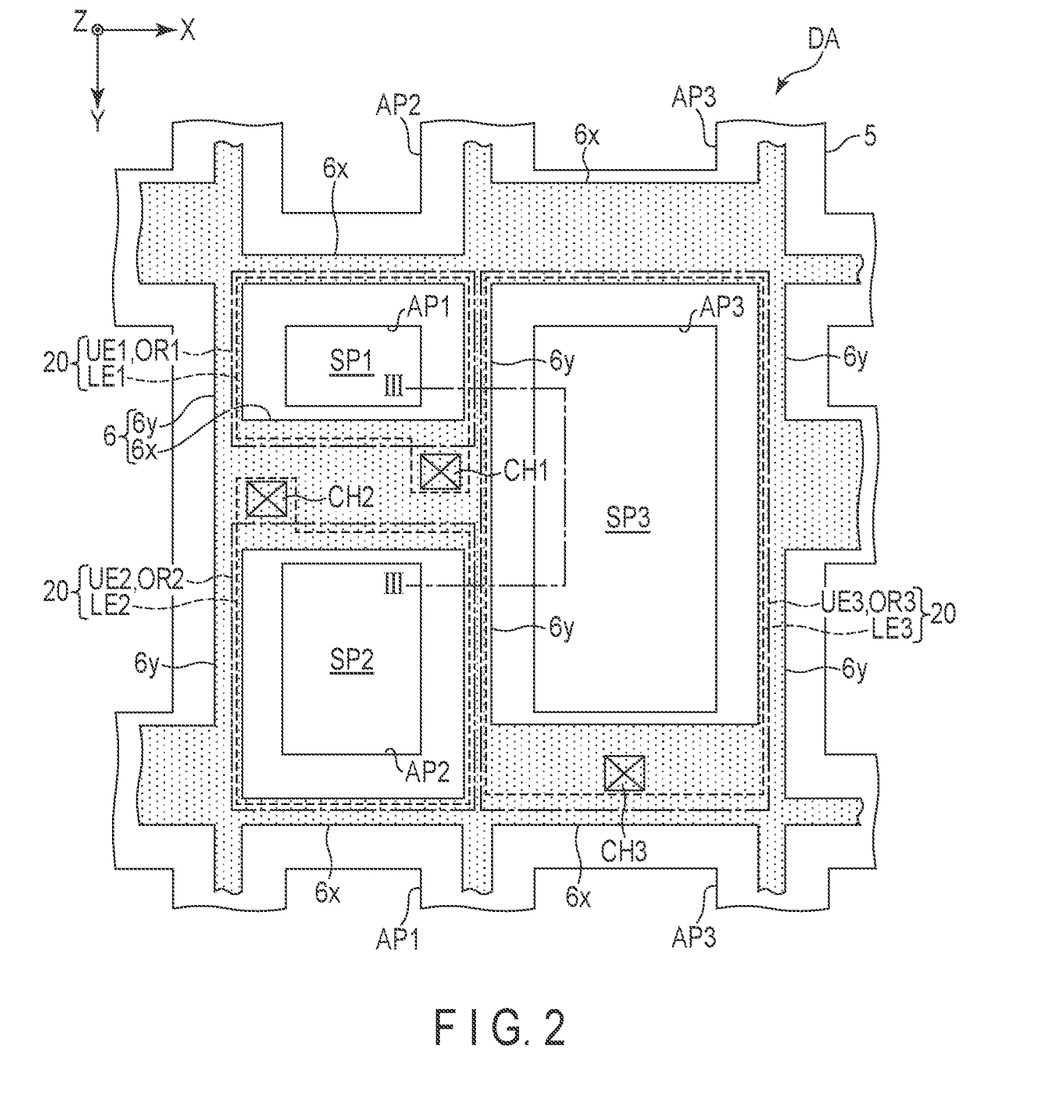
FIG. 2 is a diagram showing an example of layout of subpixels.

FIG. 2 is a diagram showing an example of layout of subpixels SP1, SP2 and SP3. In the example of FIG. 2, the subpixel SP1 and the subpixel SP2 are aligned along the second direction Y. Further, the subpixel SP1 and the subpixel SP2 are each aligned with the subpixel SP3 along in the first direction X.

When the subpixels SP1, SP2 and SP3 have such a layout, rows in each of which the subpixels SP1 and SP2 are arranged alternately along the second direction Y and rows in each of which the subpixels SP3 are arranged repeatedly along the second direction Y are formed in the display area DA. These rows are arranged alternately along the first direction X.

Note that the layout of the subpixels SP1, SP2 and SP3 is not limited to that of the example in FIG. 2. As another example, the subpixels SP1, SP2 and SP3 in each pixel PX may be arranged in order along the first direction X.

In the display area DA, a rib 5 and a partition 6 are arranged. The rib 5 includes pixel apertures AP1, AP2 and AP3 in the subpixels SP1, SP2 and SP3, respectively. In the example of FIG. 2, the pixel aperture AP2 is greater in size than the pixel aperture AP1, and the pixel aperture AP3 is greater in size than the pixel aperture AP2.

The partition 6 is placed at the boundary of each pair of subpixels SP adjacent to each other, so as to overlap the rib 5 in plan view. The partition 6 includes a plurality of first partitions 6x extending along the first direction X and a plurality of second partitions 6y extending along the second direction Y. The first partitions 6x are each disposed between each pair of pixel apertures AP1 and AP2 adjacent to each other along the second direction Y and between each pair of pixel apertures AP3 adjacent to each other along the second direction Y. The second partitions 6y are each disposed between each pair of pixel apertures AP1 and AP3 adjacent to each other along the first direction X and between each pair of pixel apertures AP2 and AP3 adjacent to each other along the first direction X.

In the example of FIG. 2, the first partitions 6x and the second partitions 6y are connected to each other. With this structure, the partition 6, as a whole, has a lattice-like shape which surrounds the pixel apertures AP1, AP2 and AP3. It can as well be said that the partition 6 includes apertures in the subpixels SP1, SP2 and SP3, respectively, as in the case of the rib 5.

The subpixels SP1 each comprise a lower electrode LE1, an upper electrode UE1, and an organic layer OR1, which overlap the respective pixel aperture AP1. The subpixels SP2 each comprise a lower electrode LE2, an upper electrode UE2 and an organic layer OR2, which overlap the respective pixel aperture AP2. The subpixels SP3 each comprise a lower electrode LE3, an upper electrode UE3 and an organic layer OR3, which overlap the respective pixel aperture AP3. In the example of FIG. 2, outlines of the upper electrode UE1 and the organic layer OR1 match each other, the outlines of the upper electrode UE2 and the organic layer OR2 match each other, and outlines of the upper electrode UE3 and the organic layer OR3 match each other.

The lower electrode LE1, the upper electrode UE1 and the organic layer OR1 constitute the display element 20 of the subpixel SP1. The lower electrode LE2, the upper electrode UE2 and the organic layer OR2 constitute the display element 20 of the subpixel SP2. The lower electrode LE3, the upper electrode UE3 and the organic layer OR3 constitute the display element 20 of the subpixel SP3.

The lower electrode LE1 is connected to the pixel circuit 1 (see FIG. 1) of the subpixel SP1 via a contact hole CH1. The lower electrode LE2 is connected to the pixel circuit 1 of the subpixel SP2 via a contact hole CH2. The lower electrode LE3 is connected to the pixel circuit 1 of the subpixel SP3 via a contact hole CH3.

In the example of FIG. 2, the contact holes CH1 and CH2 entirely overlap the respective first partitions 6x between the pixel apertures AP1 and AP2 adjacent to each other along the second direction Y. The contact hole CH3 entirely overlaps the respective first partition 6x between each pair of pixel apertures AP3 adjacent to each other along the second direction Y. As another example, at least a part of the contact holes CH1, CH2 and CH3 may not overlap the respective first partition 6x.

Figure 3:
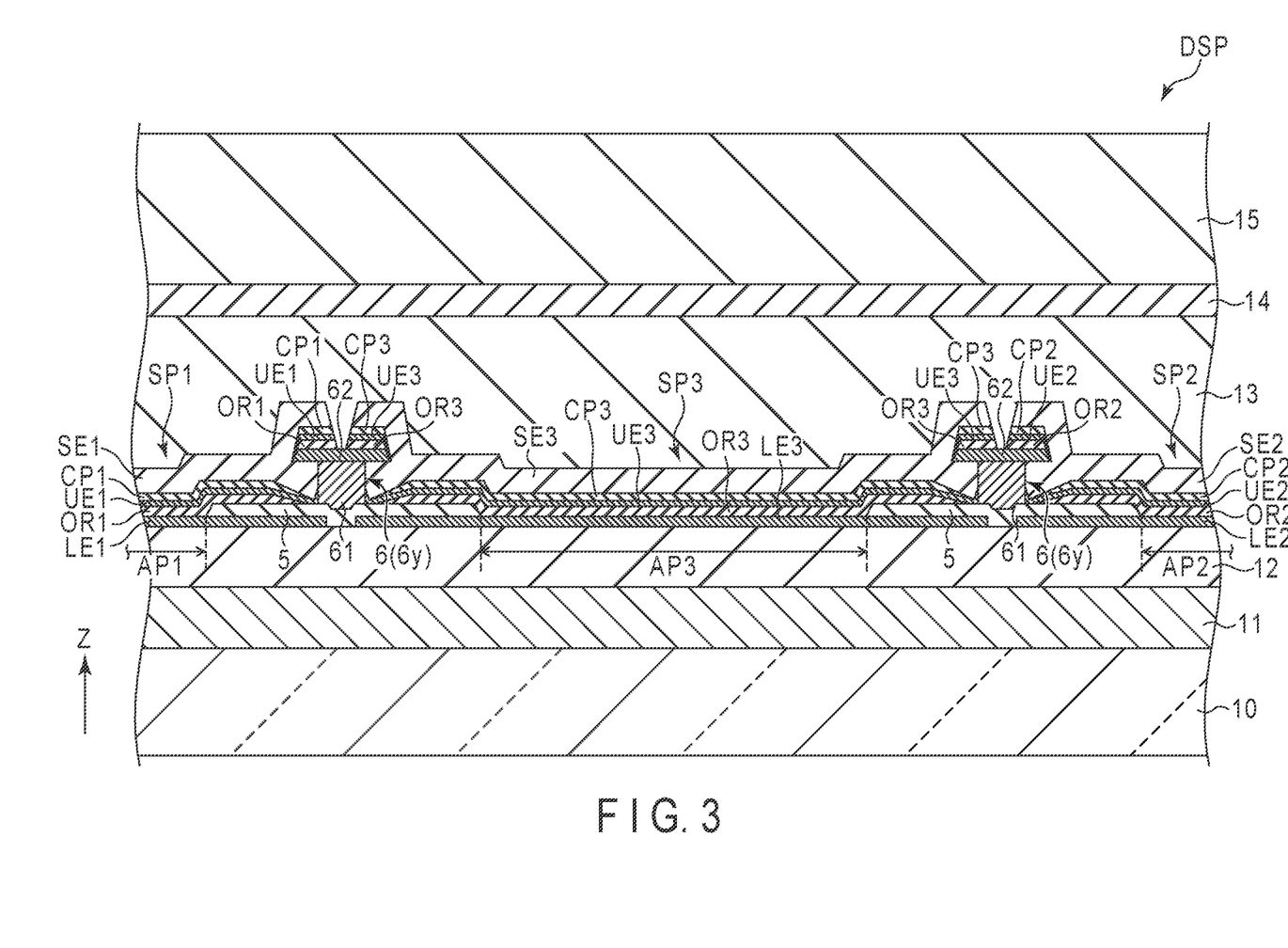
FIG. 3 is a schematic cross-sectional view of the display device taken along line III-III in FIG. 2.

FIG. 3 is a cross-sectional view schematically showing the display device DSP taken along line III-III in FIG. 2. On the substrate 10 described above, a circuit layer 11 is disposed. The circuit layer 11 includes various circuits and wiring lines such as the pixel circuit 1, the scanning line GL, the signal line SL and the power line PL shown in FIG. 1. The circuit layer 11 is covered by an organic insulating layer 12. The organic insulating layer 12 functions as a planarization film to planarize unevenness caused by the circuit layer 11. Although not shown in the cross section of FIG. 3, the contact holes CH1, CH2 and CH3 described above are provided in the organic insulating layer 12.

The lower electrodes LE1, LE2 and LE3 are disposed on the organic insulating layer 12. The rib 5 is disposed on the organic insulating layer 12 and the lower electrodes LE1, LE2 and LE3. End portions of the lower electrodes LE1, LE2 and LE3 are covered by the rib 5.

The partition 6 includes a conductive lower portion 61 disposed above the rib 5 and an upper portion 62 disposed above the lower portion 61. The upper portion 62 has a width greater than that of the lower portion 61. With this configuration, in FIG. 3, both the end portions of the upper portion 62 protrude beyond respective side surfaces of the lower portion 61. Such a shape of the partition 6 may as well be referred to as an overhang shape.

The organic layer OR1 covers the lower electrode LE1 via the pixel aperture AP1. The upper electrode UE1 covers the organic layer OR1 and opposes the lower electrode LE1. The organic layer OR2 covers the lower electrode LE2 via the pixel aperture AP2. The upper electrode UE2 covers the organic layer OR2 and opposes the lower electrode LE2. The organic layer OR3 covers the lower electrode LE3 via the pixel aperture AP3. The upper electrode UE3 covers the organic layer OR3 and opposes the lower electrode LE3.

In the example of FIG. 3, a cap layer CP1 is disposed on the organic layer OR1, a cap layer CP2 is disposed on the organic layer OR2, and a cap layer CP3 is disposed on the organic layer OR3. The cap layers CP1, CP2 and CP3 adjust the optical properties of the light emitted by the organic layers OR1, OR2 and OR3, respectively.

Parts of the organic layer OR1, the upper electrode UE1 and the cap layer CP1 are located above the upper portion 62. The parts are separated from other parts of the organic layer OR1, the upper electrode UE1 and the cap layer CP1. Similarly, parts of the organic layer OR2, the upper electrode UE2 and the cap layer CP2 are located above the upper portion 62, and the parts are separated from other parts of the organic layer OR2, the upper electrode UE2 and the cap layer CP2. Further, parts of the organic layer OR3, the upper electrode UE3 and the cap layer CP3 are located above the upper portion 62, and the parts are separated from other parts of the organic layer OR3, the upper electrode UE3 and the cap layer CP3.

In the subpixels SP1, SP2 and SP3, sealing layers SE1, SE2 and SE3 are disposed, respectively. The sealing layer SE1 continuously covers the cap layer CP1 and the partition 6. The sealing layer SE2 continuously covers the cap layer CP2 and the partition 6. The sealing layer SE3 continuously covers the cap layer CP3 and the partition 6.

In the example of FIG. 3, the organic layer OR1, the upper electrode UE1, the cap layer CP1 and the sealing layer SE1 on the partition 6 between the subpixels SP1 and SP3 are spaced apart from the organic layer OR3, the upper electrode UE3, the cap layer CP3 and the sealing layer SE3 on this partition 6, respectively. Further, the organic layer OR2, the upper electrode UE2, the cap layer CP2 and the sealing layer SE2 on the partition 6 between the subpixels SP2 and SP3 are spaced apart from the organic layer OR3, the upper electrode UE3, the cap layer CP3 and the sealing layer SE3 on this partition 6, respectively.

The sealing layers SE1, SE2 and SE3 are covered by a resin layer 13. The resin layer 13 is covered by a sealing layer 14. Further, the sealing layer 14 is covered by a resin layer 15.

The organic insulating layer 12 and the resin layers 13 and 15 are formed of organic materials. The rib 5 and the sealing layers 14, SE1, SE2 and SE3 are formed, for example, of an inorganic material such as silicon nitride (SiNx). The rib 5 and the sealing layers 14, SE1, SE2 and SE3 each may be formed as a single layer of one of silicon oxide (SiOx), silicon oxynitride (SiON) and aluminum oxide ($Al_2O_3$). The rib 5 and the sealing layers 14, SE1, SE2 and SE3 may as well be formed as a stacked layer body of any combination of at least two of a silicon nitride layer, a silicon oxide layer, a silicon oxynitride layer and an aluminum oxide layer.

The upper electrodes UE1, UE2 and UE3 are formed, for example, of a metal material such as an alloy of magnesium and silver (MgAg). When the potential of the lower electrodes LE1, LE2 and LE3 is relatively higher than that of the upper electrodes UE1, UE2 and UE3, the lower electrodes LE1, LE2 and LE3 correspond to anodes, respectively, and the upper electrodes UE1, UE2 and UE3 correspond to cathodes, respectively. When the potential of the upper electrodes UE1, UE2 and UE3 is relatively higher than that of the lower electrodes LE1, LE2 and LE3, the upper electrodes UE1, UE2 and UE3 correspond to the anodes and the lower electrodes LE1, LE2 and LE3 correspond to the cathode.

The organic layers OR1, OR2 and OR3 each include a pair of functional layers and an emitting layer disposed between these functional layers. For example, the organic layers OR1, OR2 and OR3 each have a structure in which a hole injection layer, a hole transport layer, an electron blocking layer, an emitting layer, a hole blocking layer, an electron transport layer and an electron injection layer are stacked in order.

The cap layers CP1, CP2 and CP3 are formed, for example, by a multilayer body of a plurality of transparent thin films. The multilayer body may include, as the thin films, those formed of inorganic materials and those formed of organic materials. These thin films have refractive indices different from each other. The materials of the thin films which constitute the multilayer body are different from the material of the upper electrodes UE1, UE2 and UE3, and also from the material of the sealing layers SE1, SE2 and SE3. Note that at least one of the cap layers CP1, CP2 and CP3 may be omitted.

To the partition 6, a common voltage is supplied. The common voltage is supplied to each of the upper electrodes UE1, UE2 and UE3, which are in contact with the side surface of the lower portion 61. To the lower electrodes LE1, LE2 and LE3, pixel voltages are supplied via the respective pixel circuits 1 of the subpixels SP1, SP2 and SP3.

When a potential difference is created between the lower electrode LE1 and the upper electrode UE1, the emitting layer of the organic layer OR1 emits light in the red wavelength range. When a potential difference is created between the lower electrode LE2 and the upper electrode UE2, the emitting layer of the organic layer OR2 emits light in the green wavelength range. When a potential difference is created between the lower electrode LE3 and the upper electrode UE3, the emitting layer of the organic layer OR3 emits light in the blue wavelength range.

Figure 4:
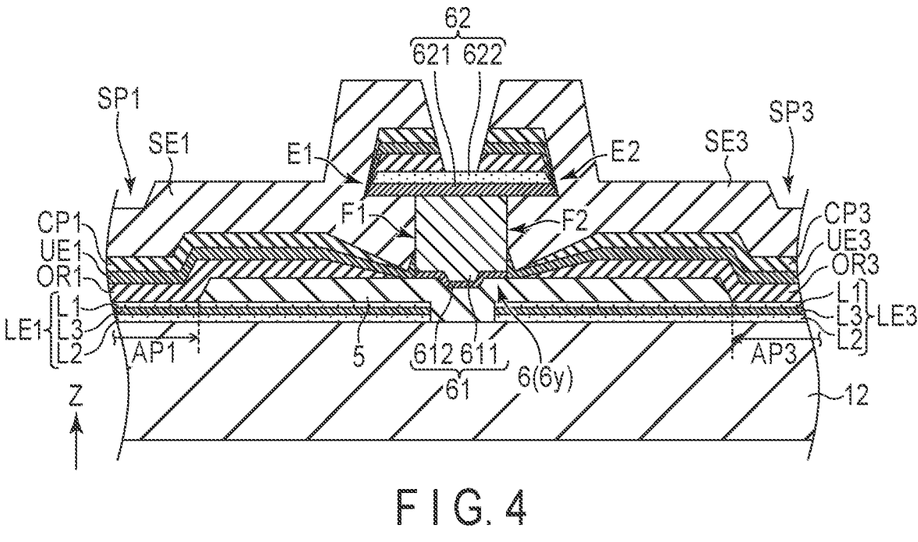
FIG. 4 is an enlarged cross sectional view showing a partition and its vicinity.

FIG. 4 is an enlarged cross-sectional view schematically showing the partition 6 and its vicinity located at the boundary between the subpixels SP1 and SP2. In this drawing, the substrate 10, the circuit layer 11, the resin layer 13, the sealing layer 14 and the resin layer 15 are omitted from illustration.

The lower portion 61 of the partition 6 includes a side surface F1 and a side surface F2. The upper portion 62 of the partition 6 includes an end portion E1 protruding from the side surface F1 and an end portion E2 protruding from the side surface F2. The upper electrodes UE1 and UE3 are in contact with the side surfaces F1 and F2, respectively.

In the example of FIG. 4, the lower portion 61 includes a first metal layer 611 and a second metal layer 612 which is thinner than the first metal layer 611. The second metal layer 612 is located between the rib 5 and the first metal layer 611. Further, the upper portion 62 incudes a first thin film 621 disposed on the first metal layer 611 and a second thin film 622 disposed on the first thin film 621.

The first metal layer 611 is formed, for example, of aluminum (Al). Note that the first metal layer 611 may be formed, for example, of an aluminum alloy, or may have a multilayer structure of aluminum and an aluminum alloy. The second metal layer 612 is formed, for example, of molybdenum (Mo).

The first thin film 621 is formed, for example, of titanium (Ti). The first thin film 621 may be formed of an inorganic material such as silicon oxide. The second thin film 622 is formed, for example, of a transparent conductive oxide such as indium tin oxide (ITO), indium zinc oxide (IZO) or indium gallium zinc oxide (IGZO). The upper portion 62 may have a single layer structure of titanium, silicon oxide or the like.

In the example of FIG. 4, the lower electrode LE1 includes a first conductive oxide layer L1, a second conductive oxide layer L2 and an intermediate layer L3 between the first conductive oxide layer L1 and the second conductive oxide layer L2. The first conductive oxide layer L1 covers an upper surface of the intermediate layer L3 and the second conductive oxide layer L2 covers a lower surface of the intermediate layer L3.

The conductive oxide layers L1 and L2 are formed of ITO, for example. In other words, the upper surface and the lower surface of the lower electrode LE1 are formed of ITO. In another example, the conductive oxide layers L1 and L2 may be formed of IZO or IGZO or the like. The intermediate layer L3 is formed of a metal material of silver (Ag), for example. The lower electrodes LE2 and LE3 as well have a structure similar to that of the lower electrode LE1.

Figure 5:
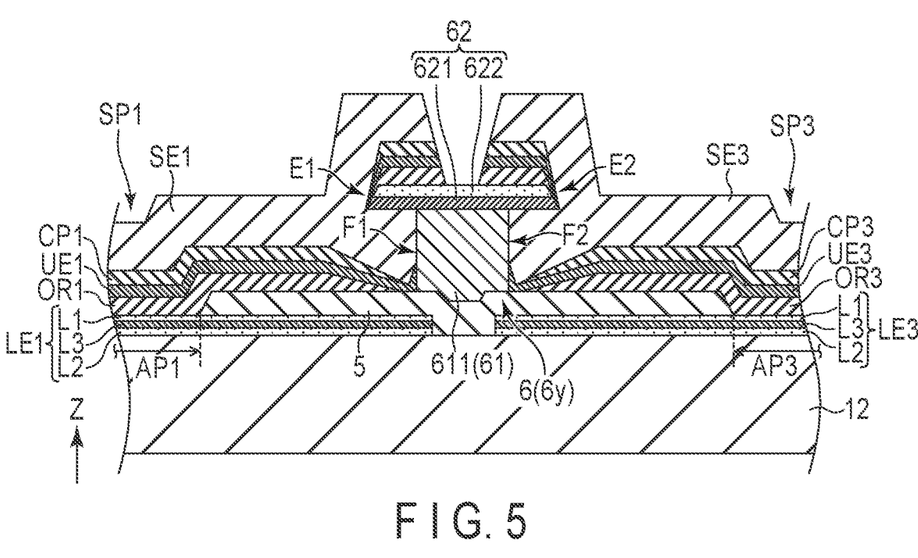
FIG. 5 is a cross-sectional view schematically showing another example of a configuration that can be applied to the partition.

FIG. 5 is a cross-sectional view schematically showing another example of the structure that can be applied to the partition 6. In the example illustrated in this figure, the lower portion 61 does not include the second metal layer 612 shown in FIG. 4. In other words, the lower portion 61 is formed from the first metal layer 611. The first metal layer 611 is in contact with the upper surface of the rib 5.

In the example of FIG. 5 as well, the first metal layer 611 may be formed of aluminum or an aluminum alloy, or may have a stacked multiplayer structure of aluminum and an aluminum alloy.

Next, the structure that may be applied to the surrounding area SA will be described.

Figure 6:
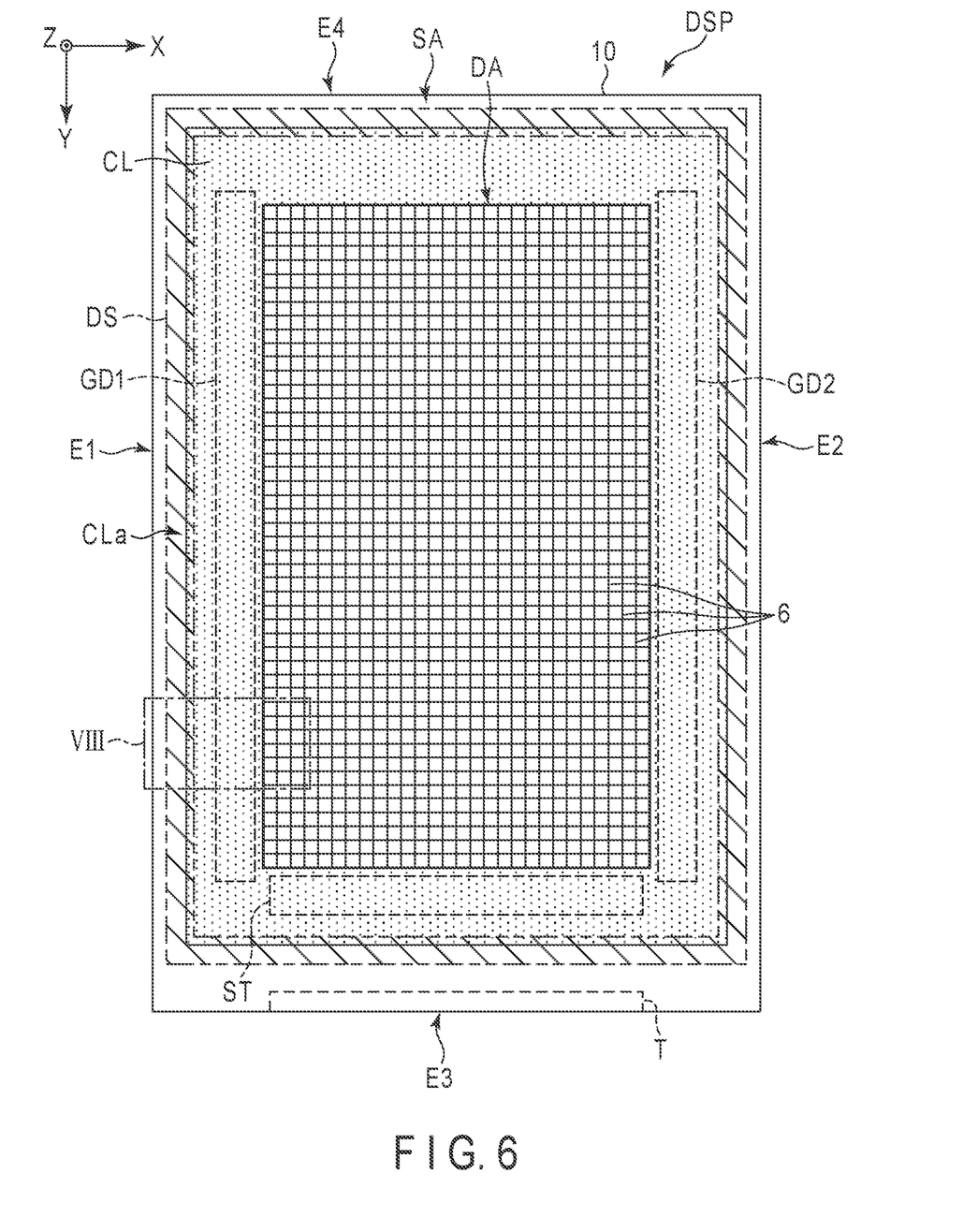
FIG. 6 is a plan view schematically showing some elements of the display device.

FIG. 6 is a plan view schematically showing the display device DSP. The display device DSP comprises a first gate drive circuit GD1, a second gate drive circuit GD2, a selector circuit ST and a terminal portion T as elements arranged in the surrounding area SA. The first gate drive circuit GD1, the second gate drive circuit GD2 and the selector circuit ST are each an example of a drive circuit that supply signals to the pixel circuit 1, and are included in the circuit layer 11 shown in FIG. 3.

The first gate drive circuit GD1 and the second gate drive circuit GD2 supply scanning signals to the scanning lines GL shown in FIG. 1. To the terminal portion T, a flexible circuit board, for example, is connected. The selector circuit ST supplies video signals input from the flexible circuit board to the signal line SL shown in FIG. 1.

The substrate 10 includes a first end portion E1, a second end portion E2, a third end portion E3 and a fourth end portion E4. The first end portion E1 and the second end portion E2 extend parallel to the second direction Y. The third end portion E3 and the fourth end portion E4 extend parallel to the first direction X.

In the example of FIG. 6, the first gate drive circuit GD1 is disposed between the display area DA and the first end portion E1, the second gate drive circuit GD2 is disposed between the display area DA and the second end portion E2, and the selector circuit ST and the terminal portion T are disposed between the display area DA and the third end portion E3.

Further, the display device DSP comprises a conductive layer CL (a portion indicated by dot pattern) and a dam structure DS (a portion indicated by shaded pattern) located in the surrounding area SA. In the example of FIG. 6, the conductive layer CL surrounds the display area DA. Further, the dam structure DS surrounds the conductive layer CL.

The conductive layer CL and the dam structure DS partially overlap each other. For example, the dam structure DS serves to dam the resin layer 13 shown in FIG. 2.

The conductive layer CL is connected to the partition 6 disposed in the display area DA. The conductive layer CL overlaps the first gate drive circuit GD1, the second gate drive circuit GD2 and the selector circuit ST in plan view.

Note that the conductive layer CL does not necessarily need to have such a shape as to surround the display area DA. For example, the conductive layer CL may not be placed between the display area DA and the third end portion E3 or between the display area DA and the fourth end portion E4.

Figure 7:
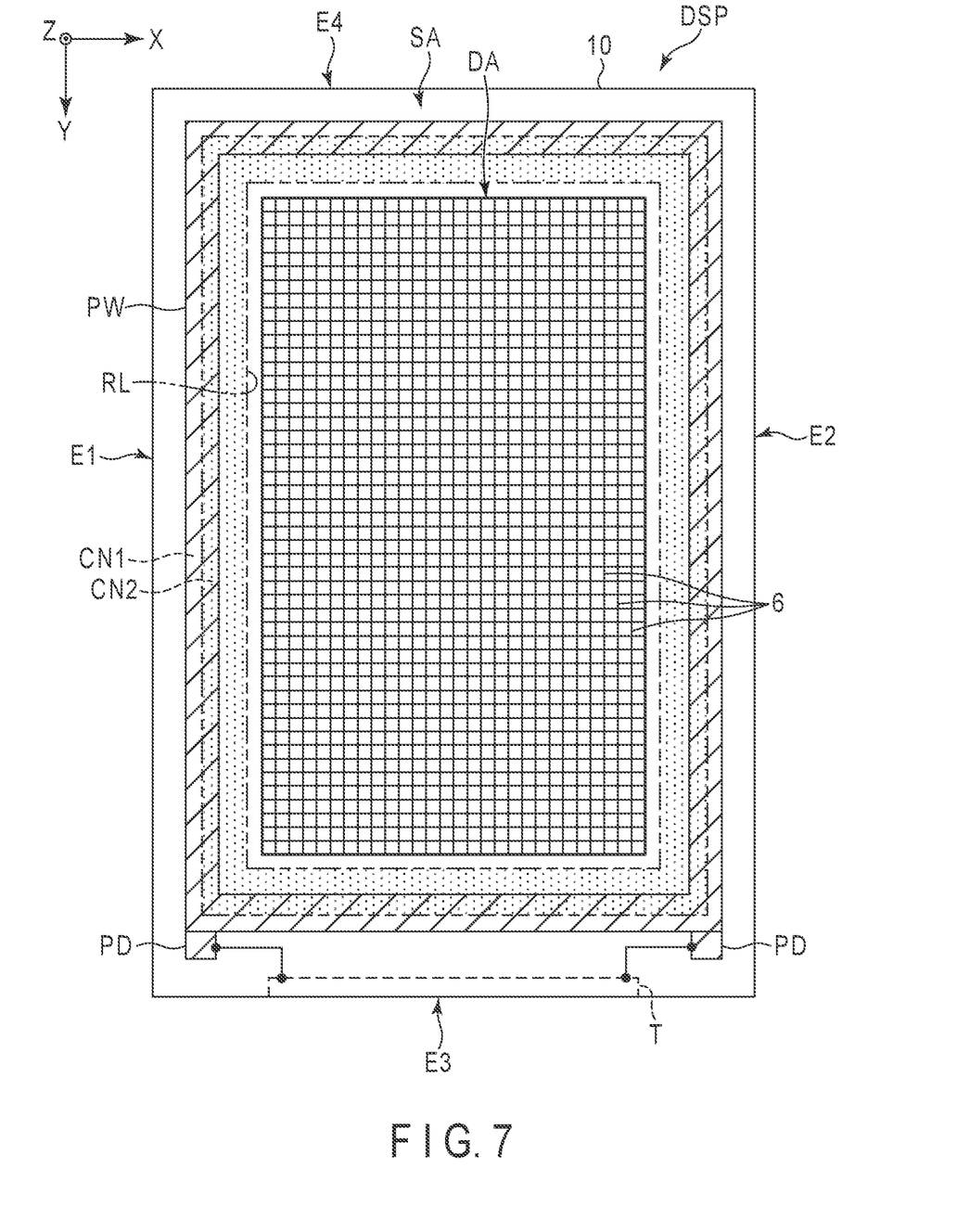
FIG. 7 is a plan view schematically showing other elements of the display device.

FIG. 7 is a plan view schematically showing other elements disposed in the surrounding area SA. In the surrounding area SA, a feed line PW (a portion indicated by shaded pattern) and a relay wiring line RL (a portion indicated by dot pattern) are disposed.

In FIG. 7, the feed line PW and the relay wiring line RL surround the display area DA, but the configuration is not limited to that of this example. The feed line PW and the relay wiring line RL partially overlap each other.

The feed line PW has a pair of pads PD located in the vicinity of the third end portion E3. These pads PD are electrically connected to the terminal portion T. To the feed line PW, the common voltage is supplied via the terminal portion T and each pad PD. Further, the common voltage of the feed line PW is supplied to the relay wiring line RL.

Figure 8:
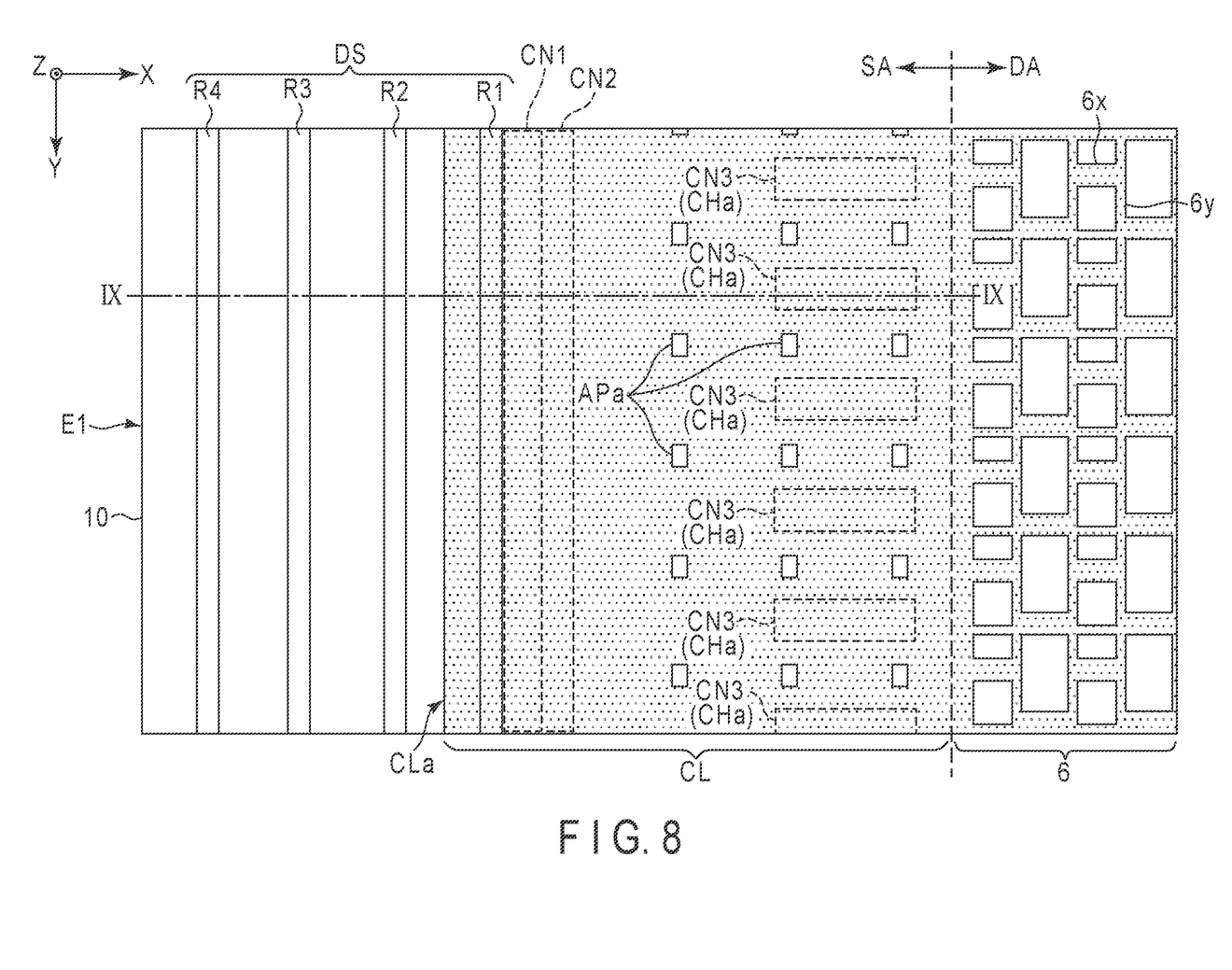
FIG. 8 is an enlarged view of an area enclosed by a chain line frame in FIG. 6.
Figure 9:
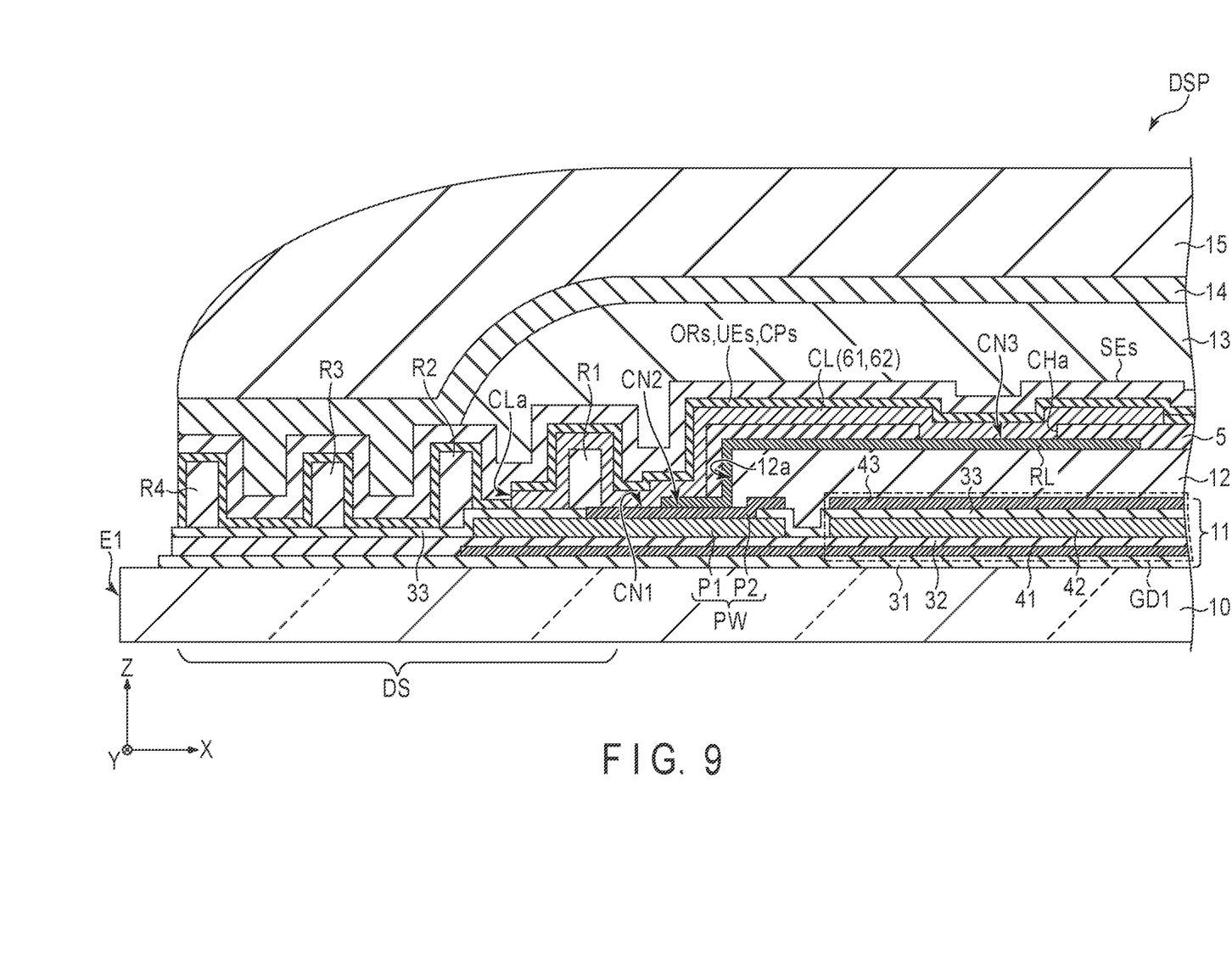
FIG. 9 is a cross-sectional view schematically showing the display device taken along line IX-IX in FIG. 8.

FIG. 8 is an enlarged view of the region enclosed by the frame VIII illustrated by chained line in FIG. 6. FIG. 9 is a cross-sectional view schematically showing the display device DSP along line IX-IX in FIG. 8. The region indicated by the dot pattern in FIG. 8 corresponds to the conductive layer CL and the partitions 6 (the first partition 6x and the second partition 6y). The conductive layer CL and the partition 6 are formed to be integrated with each other by the same manufacturing process from the same material.

As shown in FIGS. 8 and 9, the dam structure DS includes a first protrusion R1, a second protrusion R2, a third protrusion R3 and a fourth protrusion R4. The first protrusion R1 surrounds the display area DA, the second protrusion R2 surrounds the first protrusion R1, the third protrusion R3 surrounds the second protrusion R2, and the fourth protrusion R4 surrounds the third protrusion R3. Note that the number of protrusions of the dam structure DS is not limited to four, but may be three or less or five or more.

As shown in FIG. 9, the protrusions R1, R2, R3 and R4 are located between an end portion 12a of the organic insulating layer 12 and the first end portion E1 of the substrate 10. The protrusions R1, R2, R3 and R4 are located between the end portion 12a and the second end portion E2, between the end portion 12a and the third end portion E3, and between the end portion 12a and the fourth end portion E4, as well. The protrusions R1, R2, R3 and R4 are formed by the same process and from the same material as those of the organic insulating layer 12, for example.

The interval between any adjacent pair of protrusions R1, R2, R3 and R4 is greater than the width of the respective one of the protrusions R1, R2, R3 and R4. For example, the width of each of the protrusions R1, R2, R3 and R4 is 15 to 25 μm, and the interval between any adjacent pair of protrusions R1, R2, R3 and R4 is 25 to 35 μm. The height of each of the protrusions R1, R2, R3 and R4 is 3 to 4 μm.

In the example of FIG. 9, the circuit layer 11 comprises insulating layers 31, 32 and 33 and metal layers 41, 42 and 43. The insulating layer 31 covers the substrate 10. The metal layer 41 is disposed on the insulating layer 31 and covered by the insulating layer 32. The metal layer 42 is disposed on the insulating layer 32 and covered by the insulating layer 33. The metal layer 43 is disposed on the insulating layer 33 and covered by the organic insulating layer 12.

The insulating layers 31, 32 and 33 are formed of, for example, an inorganic material such as silicon nitride, silicon oxide or the like. The metal layers 41, 42 and 43 have a single-layer structure of a metal material such as molybdenum (Mo), tungsten (W), molybdenum-tungsten alloy (MoW), aluminum (Al) or copper (Cu) or a multilayer structure of any of these.

The first gate drive circuit GD1 is formed from the metal layers 41, 42 and 43 and semiconductor layers. The second gate drive circuit GD2 and the selector circuit ST shown in FIG. 6 and the pixel circuit 1 shown in FIG. 1 are formed similarly from the metal layers 41, 42 and 43 and semiconductor layers. Further, the scanning lines GL, the signal lines SL and the power lines PL shown in FIG. 1 are formed from one of the metal layers 41, 42 and 43.

The protrusions R1, R2, R3 and R4 are disposed on the insulating layer 33. The rib 5 is disposed in the surrounding area SA as well. In the example of FIG. 9, the rib 5 is not disposed in the dam structure DS.

The conductive layer CL covers the rib 5 in the surrounding area SA. The conductive layer CL includes a lower portion 61 and an upper portion 62 as in the case of the partition 6 shown in FIGS. 3 and 5. In the conductive layer CL as well, an end portion of the upper portion 62 protrudes further from a side surface of the lower portion 61.

As shown in FIGS. 8 and 9, the conductive layer CL covers a part of the dam structure DS. The conductive layer CL includes an end portion CLa located between the first protrusion R1 and the first end portion E1 of the substrate 10. The end portion CLa of the conductive layer CL is located between the first protrusion R1 and the second end portion E2, between the first protrusion R1 and the third end portion E3, and between the first protrusion R1 and the fourth end portion E4, as well. In other words, the end portion CLa is located between the first protrusion R1 and the end portion of the substrate 10 over the entire circumference. Further, as shown in FIG. 6, the end portion CLa is located between the first gate drive circuit GD1 and the first end portion E1, between the second gate drive circuit GD2 and the second end portion E2, and between the selector circuit ST and the third end portion E3.

In the example of FIG. 9, the conductive layer CL covers the first protrusion R1, and further, the end portion CLa is located on the insulating layer 33 between the protrusions R1 and R2. The configuration is not limited to that of this example, but the end portion CLa may be located between the protrusions R2 and R3 and between the protrusions R3 and R4.

In the example of FIG. 9, the feed line PW includes a first portion P1 formed from the metal layer 42 and a second portion P2 formed from the metal layer 43. The second portion P2 is in contact with the first portion P1. For example, of the feed line PW shown in FIG. 7, the pad PD is formed from the first portion P1 and the portion surrounding the display area DA is formed from at least the second portion P2.

The relay wiring line RL is mostly placed on the organic insulating layer 12 and covered by the rib 5. The relay wiring line RL is formed by the same manufacturing process and of the same material as those of the lower electrodes LE1, LE2 and LE3. Therefore, the relay wiring line RL includes a first conductive oxide layer L1, a second conductive oxide layer L2 and an intermediate layer L3 as in the case of the lower electrodes LE1, LE2 and LE3.

The conductive layer CL is connected to the feed line PW in a first contact portion CN1. The relay wiring line RL is connected to the feed line PW in a second contact portion CN2 and to the conductive layer CL in a third contact portion CN3. With this configuration, to the conductive layer CL, the common voltage of the feed line PW is supplied directly from the power feed line PW or via the relay wiring line RL. Further, the common voltage of the conductive layer CL is supplied to the partition 6 of the display area DA and the upper electrodes UE1, UE2 and UE3.

In the first contact portion CN1, the lower portion 61 of the conductive layer CL is in contact with the upper surface of the second portion P2 of the feed line PW. The first contact portion CN1 corresponds to a part of the region of the relay wiring line RL shown in FIG. 7, for example, which does not overlap with the feed line PW, and surrounds the display area DA in plan view. Note here that the first contact portion CN1 may be interrupted at least at one place around the display area DA.

In the example of FIG. 9, the first contact portion CN1 is located between the end portion 12a of the organic insulating layer 12 and the first end portion E1 of the substrate 10. More specifically, the first contact portion CN1 is located between the end portion 12a of the organic insulating layer 12 and the first protrusion R1. The first contact portion CN1 is located between the end portion 12a and the second end portion E2, between the end portion 12a and the third end portion E3, and between the end portion 12a and the fourth end portion E4, as well.

In the second contact portion CN2, the relay wiring line RL is in contact with the upper surface of the second portion P2 of the feed line PW. As shown in FIG. 8, the second contact portion CN2 is located between the display area DA and the first contact portion CN1. More specifically, the second contact portion CN2 is located between the end portion 12a of the organic insulating layer 12 and the first contact portion CN1.

In the example of FIG. 9, in the second contact portion CN2, the upper surface of the relay wiring line RL is covered by the lower portion 61 of the conductive layer CL. With this configuration, the feed line PW and the conductive layer CL are electrically connected to each other in the second contact portion CN2 as well.

Note that the first contact portion CN1 and the second contact portion CN2 are adjacent to each other in the example shown in FIGS. 8 and 9, but the contact portions CN1 and CN2 may be separated from each other. For example, at least one of the protrusions R1, R2, R3 and R4 may be interposed between the first contact portion CN1 and the second contact portion CN2.

The second contact portion CN2 corresponds to the region where the feed line PW and the relay wiring line RL overlap in FIG. 7, for example, and surrounds the display area DA. Note that the second contact portion CN2 may be interrupted at least at one place around the display area DA.

As shown in FIG. 8, the third contact portion CN3 is located between the second contact portion CN2 and the display area DA in plan view. As shown in FIGS. 8 and 9, the third contact portion CN3 includes a plurality of contact holes CHa provided in the rib 5. The lower portion 61 of the conductive layer CL is in contact with the upper surface of the relay wiring line RL via these contact holes CHa.

In the example of FIG. 8, the contact holes CHa all extend longitudinally along the first direction X and are aligned along the second direction Y. The shape and arrangement of the contact holes CHa are not limited to those of this example and can be modified into in various ways.

The conductive layer CL includes a plurality of apertures APa aligned at regular intervals along the first direction X and the second direction Y. In the example of FIG. 8, some of the apertures APa are located between contact holes CHa adjacent to each other along the second direction Y. The apertures APa are smaller than the contact holes CHa in plan view, for example, respectively.

In the formation of the conductive layer CL and the partition 6, first, base layers of the lower portion 61 and the upper portion 62 are entirely formed in the display area DA and the surrounding area SA, and these layers are patterned into the shape of the conductive layer CL and the partition 6 by etching. In the display area DA, there are a number of apertures (regions surrounded by the first partitions 6x and the second partitions 6y) which respectively correspond to the subpixels SP1, SP2 and SP3. Here, if the density of such apertures differs between the display area DA and the surrounding area SA, it may not be possible to achieve uniform etching progress. In contrast, by providing multiple apertures APa in the conductive layer CL, the etching progress can be made uniform between the display area DA and the surrounding area SA.

As shown in FIG. 9, in the surrounding area SA, an organic layer ORs, an upper electrode UEs, a cap layer CPs and a sealing layer SEs are arranged. In the example in FIG. 9, the organic layer ORs, the upper electrode UEs and the cap layer CPs are illustrated as a single layer, but in reality, the upper electrode UEs covers the organic layer ORs and the cap layer CPs covers the upper electrode UEs. The organic layer ORs, the upper electrode UEs and the cap layer CPs cover the conductive layer CL and the dam structure DS. The sealing layer SEs covers the organic layer ORs, the upper electrode UEs and the cap layer CPs.

The organic layer ORs is formed by the same process and of the same material as those of one of the organic layers OR1, OR2 and OR3. The upper electrode UEs is formed by the same process and of the same material as those of one of the upper electrodes UE1, UE2 and UE3. The cap layer CPs is formed by the same process and of the same material as those of one of the cap layers CP1, CP2 and CP3. The sealing layer SEs is formed by the same process and of the same material as those of one of the sealing layers SE1, SE2 and SE3. For example, the organic layer ORs, the upper electrode UEs, the cap layer CPs and the sealing layer SEs are formed by the same process and of the same material as those of the organic layer OR3, the upper electrode UE3, the cap layer CP3, and the sealing layer SE3, respectively.

The resin layer 13 is formed, for example, by an ink-jet method. The unevenness of the sealing layer SEs created by the protrusions R1, R2, R3 and R4 serves to suppress the spreading of the resin layer 13 before being cured. In FIG. 9, the end portion of the resin layer 13 is located in the vicinity of the second protrusion R2, but the configuration is not limited to that of this example. The sealing layer 14 is in contact with the sealing layer SEs outside the end portion of the resin layer 13. The resin layer 15 covers the sealing layer 14 in its entirety.

Figure 10:
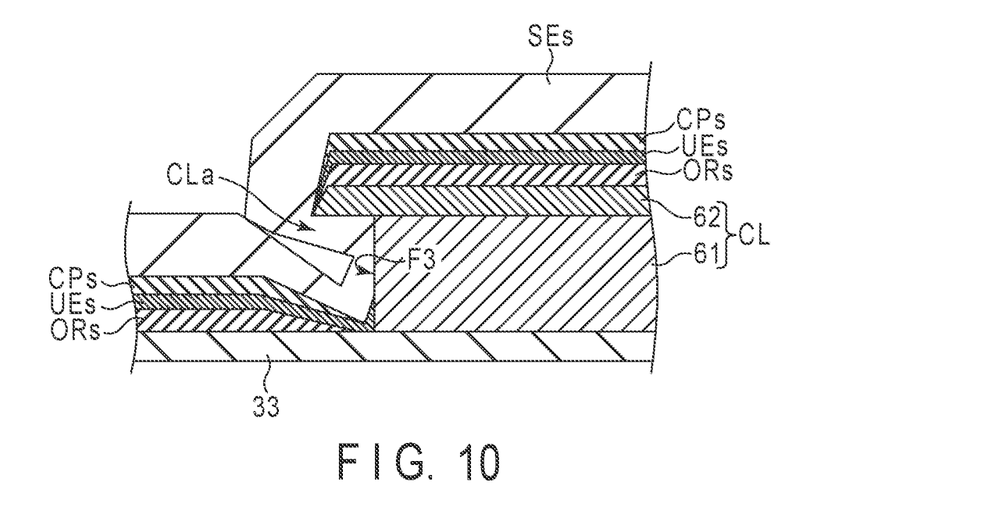
FIG. 10 is a cross-sectional view schematically showing a vicinity of an end portion of a conductive layer.

FIG. 10 is a cross-sectional view schematically showing the vicinity of the end portion CLa of the conductive layer CL. The conductive layer CL includes a lower portion 61 and an upper portion 62. The layer configuration of the lower portion 61 and the upper portion 62 of the conductive layer CL is similar to the layer configuration of the partition 6 shown in FIGS. 4 and 5.

In the end portion CLa, the lower portion 61 of the conductive layer CL includes a side surface F3. The upper portion 62 of the conductive layer CL protrudes from the side surface F3. That is, the shape of the conductive layer CL in the end portion CLa is overhang-like, as in the case of the partition 6.

When the organic layer ORs, the upper electrode UEs and the cap layer CPs are formed on the conductive layer CL of such a shape, the organic layers ORs, the upper electrode UEs and the cap layer CPs are divided at the end portion CLa, as shown in FIG. 10.

The sealing layer SEs covers the organic layers ORs, the upper electrodes UEs and the cap layers CPs now located above and below the conductive layer CL, respectively, and further covers the side surface F3 of the lower portion 61.

In FIGS. 8 to 10, the structure between the display area DA and the first end portion E1 is focused. Note that a similar structure can be applied to between the display area DA and the second end portion E2, between the display area DA and the third end portion E3, and between the display area DA and the fourth end portion E4. It is preferable that the organic layer ORs, the upper electrode UEs and the cap layer CPs are divided over the entire circumference of the end portion CLa.

In the display device DSP of the embodiment described above, the partition 6 disposed in the display area DA is connected to the conductive layer CL disposed in the surrounding area SA. Further, the partition 6 is connected to the upper electrodes UE1, UE2 and UE3 of the subpixels SP1, SP2 and SP3, and the conductive layer CL is connected to the feed line PW. In such a configuration, the common voltage of the feed line PW can be supplied to the upper electrodes UE1, UE2 and UE3 via the conductive layer CL and the partition 6.

When connecting two conductive members, it may not be possible to ensure good conductivity depending on the combination of the materials of the two. For example, if one material is aluminum and the other is ITO, electrical corrosion will occur at the interface between the two. Therefore, for example, if the lower portion 61 of the conductive layer CL is formed of aluminum as in the case of the first metal layer 611 shown in FIG. 5, and the upper surface of the relay wiring line RL is formed of ITO as in the case of the first conductive oxide layer L1 shown in FIG. 5, the connection resistance between the conductive layer CL and the relay wiring line RL in the third contact portion CN3 can be increased.

By contrast, in this embodiment, the lower portion 61 of the conductive layer CL is in contact with the feed line PW in the first contact portion CN1. Here, both the lower portion 61 and the feed line PW are made of metal, the connection resistance at the first contact portion CN1 is low. Thus, it is possible to suppress voltage drop in the conductive layer CL, the partition 6, and the upper electrodes UE1, UE2 and UE3.

Further, in this embodiment, the conductive layer CL and the feed line PW are connected to each other via the relay wiring line RL. By connecting the conductive layer CL and the feed line PW via multiple pathways in this way, the reliability of the conduction therebetween is improved.

For example, when connecting a molybdenum member and an ITO member, the above-described electric corrosion is unlikely to occur at the interface therebetween. Therefore, even if the upper surface of the relay wiring line RL is formed of ITO, good conduction between the conductive layer CL and the feed line PW can be ensured, for example, when the lower portion 61 includes a second metal layer 612 of molybdenum as in the example in FIG. 4.

When the organic layer ORs, the upper electrode UEs and the cap layer CPs are arranged in the surrounding area SA as in the example of FIG. 9, moisture may enter the inside of the display device DSP through these layers. If such moisture reaches the gate drive circuits GD1 and GD2, the selector circuit ST, the feed line PW, the pixel circuit 1 and the display element 20, an operation error of the display device DSP may occur.

By contrast, in the display device DSP of this embodiment, the end portion CLa of the conductive layer CL is located between the first protrusion R1 of the dam structure DS and the end portions E1, E2, E3 and E4 of the substrate 10. With this configuration, as shown in FIG. 10, the organic layer ORs, the upper electrode UEs and the cap layer CPs are divided, thereby making it possible to inhibit moisture from entering the inside of the display device DSP through these layers. As a result, the resistance of the display device DSP to moisture is improved. If the end portion CLa is located on an outer side with respect to the contact portions CN1, CN2 and CN3 as in the example in FIG. 9, such a configuration is even more appropriate because the entering of moisture through these contact portions CN1, CN2 and CN3 is suppressed.

The upper surfaces of the protrusions R1, R2, R3 and R4 of the dam structure DS can be curved, and therefore if the end portion CLa of the conductive layer CL is located above the protrusions R1, R2, R3 and R4 of the dam structure DS, the end portion CLa may not be formed into a good overhang shape.

By contrast, if the end portion CLa is located between the protrusions R1 and R2, as in the example in FIG. 9, the end portion CLa can be formed in a good overhang shape. Even in the case where the end portion CLa is located between the protrusions R2 and R3 or between the protrusions R3 and R4, a similar effect can be obtained.

The connection structure between the conductive layer CL and the feed line PW is not limited to that of the example shown in FIG. 9. For example, the display device DSP does not need to include the relay wiring line RL, the second contact portion CN2 and the third contact portion CN3.

Figure 11:
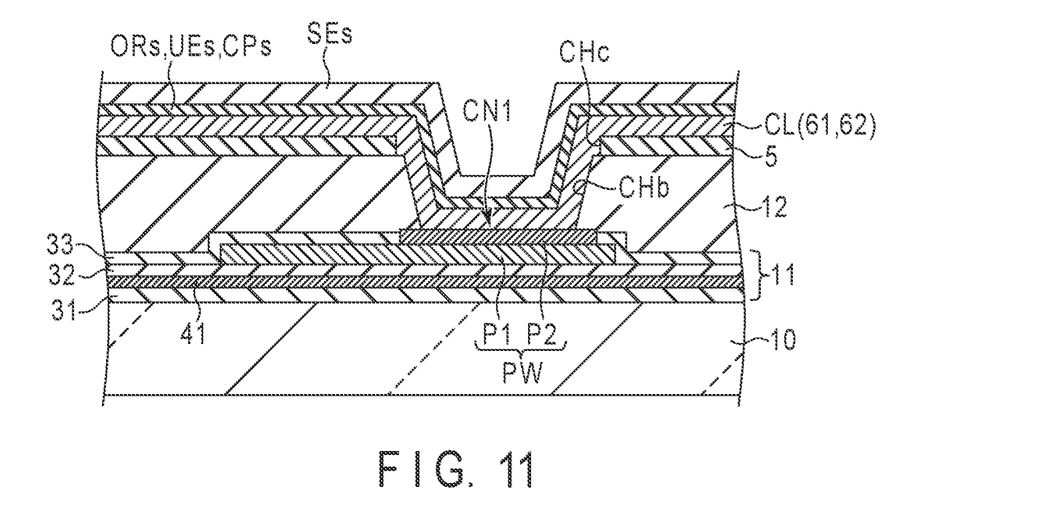
FIG. 11 is a cross-sectional view schematically showing another example of a connection structure of the conductive layer and a power feed line.

The structure of the first contact portion CN1 is not limited to that of the example shown in FIG. 9. FIG. 11 is a cross-sectional view schematically showing another example of the connection structure between the conductive layer CL and the feed line PW. In the example of FIG. 11, the first contact portion CN1 includes a contact hole CHb in the organic insulating layer 12 and a contact hole CHc in the rib 5.

The contact hole CHb exposes the second portion P2 of the feed line PW from the organic insulating layer 12. The contact hole CHc overlaps the contact hole CHb. The lower portion 61 of the conductive layer CL is in contact with the second portion P2 of the feed line PW via the contact holes CHb and CHc.

Even in the case where the first contact portion CN1 has such a configuration, the connection resistance between the conductive layer CL and the feed line PW can be lowered and thus both can be made to conduct well. In the example of FIG. 11, the relay wiring line RL shown in FIG. 9 may be further provided, and the relay wiring line RL may be connected to the feed line PW in the second contact portion CN2 and to the conductive layer CL in the third contact portion CN3.

All of the display devices that can be implemented by a person of ordinary skill in the art through arbitrary design changes based on the display devices described above as the embodiment and its modified examples of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each of the above embodiments and modified examples and are self-explanatory from the descriptions of the specification or can be arbitrarily conceived by a person of ordinary skill in the art are considered to be naturally brought about by the present invention as a matter of course.

What is claimed is:
1. A display device comprising:
a substrate;
a circuit layer including a pixel circuit disposed in a display area containing pixels, and a metal-made feed line disposed in a surrounding area between an end portion of the substrate and the display area;
an insulating layer covering the circuit layer;
a lower electrode disposed above the insulating layer in the display area, to which voltage is supplied from the pixel circuit;
a rib including an aperture overlapping the lower electrode;
a partition disposed above the rib in the display area;
an upper electrode opposing the lower electrode and connected to the partition;
an organic layer disposed between the lower electrode and the upper electrode and emitting light in response to a potential difference between the lower electrode and the upper electrode; and
a conductive layer disposed in the surrounding area and connected to the partition,
wherein
the partition and the conductive layer each includes a metal-made lower portion and an upper portion protruding from a side surface of the lower portion, and
the lower portion of the conductive layer and the feed line are in contact with each other in the first contact portion located in the surrounding area.

2. The display device of claim 1, wherein
the first contact portion is located between an end portion of the insulating layer and the end portion of the substrate in plan view.

3. The display device of claim 1, wherein
the first contact portion surrounds the display area.

4. The display device of claim 1, further comprising a relay wiring line connected to the feed line in a second contact portion located in the surrounding area and connected to the conductive layer in a third contact portion located in the surrounding area.

5. The display device of claim 4, wherein
the second contact portion is located between the display area and the first contact portion in plan view.

6. The display device of claim 4, wherein
the third contact portion is located between the display area and the second contact portion in plan view.

7. The display device of claim 4, wherein
the relay wiring line is covered by the rib, the third contact portion includes a plurality of contact holes provided in the rib, and the conductive layer is in contact with the relay wiring line via the plurality of contact holes.

8. The display device of claim 1, further comprising a dam structure including a protrusion disposed in the surrounding area, wherein the first contact portion is located between an end portion of the insulating layer and the protrusion in plan view.

9. The display device of claim 8, wherein the end portion of the conductive layer is located between the protrusion and the end portion of the substrate in plan view.

10. The display device of claim 8, wherein the dam structure includes a first protrusion surrounding the display area and a second protrusion surrounding the first protrusion, and an end portion of the conductive layer is located between the first protrusion and the second protrusion in plan view.

11. The display device of claim 1, further comprising a drive circuit disposed in the surrounding area and supplying a signal to the pixel circuit, and an end portion of the conductive layer is located between the drive circuit and the end portion of the substrate in plan view.

12. The display device of claim 1, wherein the organic layer is disposed in the surrounding area as well, and the organic layer is divided by an end portion of the conductive layer.

13. The display device of claim 1, wherein an upper surface of the lower electrode is formed of ITO, and the partition and the lower portion of the conductive layer are formed of aluminum.

* * * * *